(12) United States Patent
Peral (10) Patent No.: US 7,634,198 B2
(45) Date of Patent: Dec. 15, 2009

(54) IN-LINE DISTORTION CANCELLATION CIRCUITS FOR LINEARIZATION OF ELECTRONIC AND OPTICAL SIGNALS WITH PHASE AND FREQUENCY ADJUSTMENT

(75) Inventor: Eva Peral, Altadena, CA (US)

(73) Assignee: Emcore Corporation, Albuquerque, NM (US)

( * ) Notice: Subject to any disclaimer, the term of this patent is extended or adjusted under 35 U.S.C. 154(b) by 580 days.

(21) Appl. No.: 11/472,194

(22) Filed: Jun. 21, 2006

(65) Prior Publication Data

US 2007/0297803 A1   Dec. 27, 2007

(51) Int. Cl.
*H04B 10/18* (2006.01)
*H04B 10/00* (2006.01)
*H03F 1/34* (2006.01)
*H03F 3/08* (2006.01)
*H03F 5/00* (2006.01)

(52) U.S. Cl. .................. 398/159; 398/140; 398/158; 398/163; 327/317; 330/296

(58) Field of Classification Search ......... 398/158–159; 327/317, 318
See application file for complete search history.

(56) References Cited

U.S. PATENT DOCUMENTS

| | | | |
|---|---|---|---|
| 4,075,474 A | 2/1978 | Straus et al. | |
| 4,178,559 A | 12/1979 | Nichols | |
| 4,255,724 A | 3/1981 | Bergero | |
| 4,277,763 A | 7/1981 | Ward, Jr. | |
| 4,633,197 A | 12/1986 | Vanderspool, II | |
| 4,700,151 A | 10/1987 | Nagata | |
| 4,752,743 A | 6/1988 | Pham et al. | |
| 4,890,300 A * | 12/1989 | Andrews | 375/297 |
| 4,902,983 A | 2/1990 | Fujiki et al. | |

(Continued)

FOREIGN PATENT DOCUMENTS

EP          0 370 608 A      5/1990

(Continued)

OTHER PUBLICATIONS

Tsz Yun Yum, Quan Xue, Chi Hou Chan, "A Novel Amplifier Linearization Technique Using an Anti-Parallel Reconfigurable Transistor (ART) Pair", Wireless Communications Research Center, City University of Hong Kong, IEEE 2004 MTT-S Digest, pp. 685-688.

(Continued)

*Primary Examiner*—Ken N Vanderpuye
*Assistant Examiner*—Danny W Leung (57) ABSTRACT

A distortion circuit is provided for correcting the distortion from a nonlinear circuit element by generating a frequency dependent signal having a sign opposite to the distortion signal produced by the nonlinear circuit and substantially the same magnitude. The distortion circuit includes an input signal and a first nonlinear device coupled to the input signal for generating a first signal and where the first nonlinear device has a first bias level. Also included is a second nonlinear device different from same first nonlinear device and coupled to the first nonlinear device for modifying the first signal to produce an output second signal, the second nonlinear device having a second bias level. A bias control means is provided for adjusting the first and said second bias levels so that the magnitude, phase and frequency of the output second signal can be adjusted.

12 Claims, 7 Drawing Sheets

U.S. PATENT DOCUMENTS

| | | | |
|---|---|---|---|
| 4,992,754 A | 2/1991 | Blauvelt et al. | |
| 4,998,012 A | 3/1991 | Kruse | |
| 5,013,903 A | 5/1991 | Kasper | |
| 5,038,113 A | 8/1991 | Katz et al. | |
| 5,049,832 A | 9/1991 | Cavers | |
| 5,105,165 A | 4/1992 | Bien | |
| 5,113,068 A | 5/1992 | Burke, Jr. | |
| 5,132,639 A | 7/1992 | Blauvelt et al. | |
| 5,138,275 A | 8/1992 | Abbiati et al. | |
| 5,146,079 A | 9/1992 | Lisco | |
| 5,146,177 A | 9/1992 | Katz et al. | |
| 5,161,044 A | 11/1992 | Nazarathy et al. | |
| 5,179,461 A | 1/1993 | Blauvelt et al. | |
| 5,202,553 A | 4/1993 | Geller | |
| 5,239,402 A * | 8/1993 | Little et al. | 398/202 |
| 5,252,930 A | 10/1993 | Blauvelt | |
| 5,321,710 A | 6/1994 | Cornish et al. | |
| 5,347,389 A | 9/1994 | Skrobko | |
| 5,363,056 A | 11/1994 | Blauvelt | |
| 5,373,384 A * | 12/1994 | Hebert | 398/193 |
| 5,378,937 A * | 1/1995 | Heidemann et al. | 327/306 |
| 5,381,108 A | 1/1995 | Whitmarsh et al. | |
| 5,418,637 A | 5/1995 | Kuo | |
| 5,424,680 A * | 6/1995 | Nazarathy et al. | 330/149 |
| 5,428,314 A | 6/1995 | Swafford et al. | |
| 5,430,568 A | 7/1995 | Little et al. | |
| 5,430,569 A | 7/1995 | Blauvelt et al. | |
| 5,436,749 A | 7/1995 | Pidgeon, Jr. et al. | |
| 5,453,868 A | 9/1995 | Blauvelt et al. | |
| 5,477,367 A | 12/1995 | van der Heijden | |
| 5,477,370 A | 12/1995 | Little et al. | |
| 5,481,389 A * | 1/1996 | Pidgeon et al. | 398/208 |
| 5,517,035 A | 5/1996 | Krijntjes | |
| 5,523,716 A | 6/1996 | Grebliunas et al. | |
| 5,589,797 A | 12/1996 | Gans et al. | |
| 5,600,472 A * | 2/1997 | Uesaka | 398/158 |
| 5,606,286 A | 2/1997 | Bains | |
| 5,646,573 A * | 7/1997 | Bayruns et al. | 330/59 |
| 5,699,179 A | 12/1997 | Gopalakrishnan | |
| 5,710,523 A | 1/1998 | Kobayashi | |
| 5,768,449 A * | 6/1998 | Fuse et al. | 385/1 |
| 5,798,854 A * | 8/1998 | Blauvelt et al. | 398/194 |
| 5,812,294 A | 9/1998 | Wilson | |
| 5,850,305 A | 12/1998 | Pidgeon | |
| 5,852,389 A | 12/1998 | Kumar et al. | |
| 5,939,920 A | 8/1999 | Hiraizumi | |
| 5,963,352 A | 10/1999 | Atlas et al. | |
| 6,018,266 A | 1/2000 | Wu | |
| 6,028,477 A * | 2/2000 | Gentzler | 330/149 |
| 6,055,278 A | 4/2000 | Ho et al. | |
| 6,122,085 A | 9/2000 | Bitler | |
| 6,133,790 A | 10/2000 | Zhou | |
| 6,140,874 A * | 10/2000 | French et al. | 330/149 |
| 6,144,706 A | 11/2000 | Sato et al. | |
| 6,204,718 B1 * | 3/2001 | Pidgeon, Jr. | 327/318 |
| 6,204,728 B1 | 3/2001 | Hageraats | |
| 6,232,836 B1 | 5/2001 | Zhou | |
| 6,255,908 B1 | 7/2001 | Ghannouchi et al. | |
| 6,278,870 B1 | 8/2001 | Davie et al. | |
| 6,288,610 B1 * | 9/2001 | Miyashita | 330/149 |
| 6,288,814 B1 * | 9/2001 | Blauvelt | 398/193 |
| 6,313,701 B1 | 11/2001 | Mussino et al. | |
| 6,400,229 B1 | 6/2002 | Tran et al. | |
| 6,462,327 B1 | 10/2002 | Ezell | |
| 6,466,084 B1 * | 10/2002 | Ciemniak | 327/553 |
| 6,509,789 B1 * | 1/2003 | Ciemniak | 327/551 |
| 6,519,374 B1 | 2/2003 | Stook et al. | |
| 6,542,037 B2 | 4/2003 | Noll et al. | |
| 6,549,316 B2 | 4/2003 | Blauvelt | |
| 6,570,430 B1 * | 5/2003 | Zhou | 327/317 |
| 6,577,177 B2 * | 6/2003 | Zhou et al. | 327/317 |
| 6,674,967 B2 | 1/2004 | Skrobko et al. | |
| 6,724,253 B2 | 4/2004 | Hau et al. | |
| 6,806,778 B1 | 10/2004 | Kobayashi | |
| 6,946,908 B1 | 9/2005 | Sun et al. | |
| 6,985,020 B2 * | 1/2006 | Zhou | 327/317 |
| 7,200,339 B1 * | 4/2007 | Roberts et al. | 398/159 |
| 7,202,736 B1 * | 4/2007 | Dow et al. | 330/129 |
| 7,208,992 B1 * | 4/2007 | Mukherjee et al. | 327/317 |
| 7,251,290 B2 * | 7/2007 | Rashev et al. | 375/296 |
| 7,327,913 B2 * | 2/2008 | Shpantzer et al. | 385/15 |
| 7,426,350 B1 * | 9/2008 | Sun et al. | 398/193 |
| 7,466,925 B2 * | 12/2008 | Iannelli | 398/182 |
| 2003/0117217 A1 * | 6/2003 | Matsuyoshi et al. | 330/149 |
| 2004/0047432 A1 * | 3/2004 | Iwasaki | 375/297 |
| 2005/0068102 A1 * | 3/2005 | Hongo et al. | 330/149 |
| 2005/0195038 A1 | 9/2005 | Neenan et al. | |
| 2006/0034622 A1 * | 2/2006 | Day | 398/208 |
| 2007/0008033 A1 * | 1/2007 | Okazaki | 330/149 |
| 2007/0098417 A1 * | 5/2007 | Peral et al. | 398/208 |
| 2007/0247220 A1 * | 10/2007 | Sorrells et al. | 330/10 |
| 2007/0247222 A1 * | 10/2007 | Sorrells et al. | 330/10 |
| 2007/0248156 A1 * | 10/2007 | Sorrells et al. | 375/229 |
| 2007/0297803 A1 * | 12/2007 | Peral | 398/140 |
| 2008/0095264 A1 * | 4/2008 | Deng et al. | 375/296 |

FOREIGN PATENT DOCUMENTS

| | | |
|---|---|---|
| EP | 0524758 A2 | 1/1993 |
| EP | 0620661 | 10/1994 |
| EP | 1732209 A1 | 12/2006 |
| JP | 10126284 | 5/1998 |
| WO | WO9532561 | 11/1995 |
| WO | WO 01/43278 A1 | 6/2001 |

OTHER PUBLICATIONS

Yong-Joon Jeon, Hyung-Wook Kim, Min-Seok Kim, Young-Sik Ahn, Jong-Won Kim, Ji-Youn Choi, Doo-Chan Jung, Jin-Ho Shin, "Improved HBT Linearity With a 'Post-Distortion'-Type Collector Linearizer" IEEE Microwave and Wireless Components Letters, vol. 13, No. 3, Mar. 2003, pgs.

MO1B-2; A Quad 2.7 Gb/s Parallel Optical Transceiver; By J. Ahadian et al.; pp. 13-16; Year 2004.

8100 IEEE Transactions On Nuclear Science; No. 2, New York; A Monolithically Integrated Detector-Preamplifier On High-Resistivity Silicon; By S. Holland et al.; pp. 463-468; Apr. 1990.

Journal of Solid-State Circuits, vol. 39, No. 8; Bandwidth Enhancement For Transimpedance Amplifiers; By Beham Analui et al.; pp. 1263-1270; Aug. 2004.

* cited by examiner

IN-LINE DISTORTION CANCELLATION CIRCUITS FOR LINEARIZATION OF ELECTRONIC AND OPTICAL SIGNALS WITH PHASE AND FREQUENCY ADJUSTMENT

REFERENCE TO RELATED APPLICATIONS

This application is related to U.S. patent application Ser. No. 11/262,077 filed Oct. 27, 2005 and U.S. application Ser. No. 11/148,022 filed Jun. 9, 2005.

BACKGROUND OF THE INVENTION

1. Field of the Invention

The invention relates to optical transmitters and receivers, and in particular to electronic circuits that generates a non-linear signal with adjustable phase and frequency dependence that can be used to cancel the distortion of electronic or electro-optical devices, such as semiconductor lasers or photodiodes, when connected either at the input or at the output of the device that needs to be linearized.

2. Description of the Related Art

Analog electro-optical devices such as lasers and photodiodes used in CATV and FTTH systems require a high degree of linearity. Pre-distortion and post-distortion circuits are commonly employed to correct the nonlinear behavior of opto-electronic and electronic devices by adding a nonlinear signal that cancels the undesired distortion introduced by the non-linear laser or photodiode. In order to achieve good cancellation, the added distortion needs to match in phase, magnitude and frequency content that is introduced by the non-linear device. Among pre-distortion and post-distortion techniques, in-line circuits, such as those described in U.S. Pat. No. 5,798,854, generally provide sufficient degree of linearization at a low cost. However, while pre- and post-distortion circuits described in the prior art are able to achieve sufficient degree of pre-distortion for some applications, they do not provide enough flexibility to create different frequency and phase characteristics. For example, RF amplifiers operated with low supply voltage for lower power dissipation require a large amount of distortion Some distortion circuits disclosed in U.S. Pat. No. 5,798,854 can introduce high RF loss in the transmission path and create undesired reflections when large amounts of distortion need to be generated. There are requirements that will enable large distortion with low loss and low reflection that are not satisfied by the prior art design. Moreover, some distortion circuits, such as those disclosed in U.S. Pat. No. 5,798,854 that are designed to correct second order distortion also produce undesired third order distortion, and such designs do not allow tuning of both second and third order distortion simultaneously.

SUMMARY OF THE INVENTION

1. Objects of the Invention

It is an object of the present invention to provide a distortion cancellation circuit for use in non-linear opto-electronic device such as lasers and photodiodes used in fiber optical systems.

It is an object of the present invention to provide circuits that allow simultaneous tuning of the phase and frequency response of the second order distortion.

It is also another aspect of the present invention to provide a circuit that generates high amounts of distortion with low insertion loss and good return loss.

It is also another aspect of the present invention to provide a circuit that allows tuning of both second and third order distortion simultaneously.

2. Features of the Invention

Briefly, and in general terms, the present invention provides an optical receiver having a photodetector coupled to an external optical fiber for receiving an optical communications signal and converting it into an electrical signal; an RF amplifier coupled to the electrical output of the photodetector and generating an output signal with distortion; a post-distortion circuit connected to the output of the RF amplifier for canceling the distortion in the output signal produced by the RF amplifier, propagation in the optical fiber, the photodiode or the laser transmitter, including a Schottky or varactor diode with the bias of the diode adjusted to control the magnitude, phase and frequency content of the distortion cancellation.

In another aspect, the present invention provides an optical transmitter for transmitting an optical signal over a fiber optic link to a remote receiver including a laser coupled to an external optical fiber for transmitting an optical communications signal; a pre-distortion circuit connected to the input of the laser for canceling the distortion in the optical signal at the remote receiver produced by the laser, including a Schottky or varactor diode with the bias of said diode of the magnitude, phase and frequency content of the distortion cancellation.

In another aspect, the present invention provides an in-line pre-distortion circuit for generating frequency dependent pre-distortion having a sign opposite to distortion produced by a nonlinear device and having substantially the same magnitude as the distortion produced by the nonlinear device including an input for receiving an RF signal for the nonlinear device; a nonlinear element in-line with the input for generating pre-distortion; and a bias input to control the real and imaginary part of the pre-distortion produced by the nonlinear element.

Additional objects, advantages, and novel features of the present invention will become apparent to those skilled in the art from this disclosure, including the following detailed description as well as by practice of the invention. While the invention is described below with reference to preferred embodiments, it should be understood that the invention is not limited thereto. Those of ordinary skill in the art having access to the teachings herein will recognize additional applications, modifications and embodiments in other fields, which are within the scope of the invention as disclosed and claimed herein with respect to which the invention could be of utility.

BRIEF DESCRIPTION OF THE DRAWINGS

These and other features of the present invention will be better understood and more fully appreciated by reference to the following detailed description when considered in conjunction with the accompanying drawings, wherein.

DETAILED DESCRIPTION OF THE INVENTION

The present invention is directed to a distortion correaction circuit that extends the notion of distortion correaction as set forth in U.S. Pat. No. 5,798,854. The above noted patent discloses an in-line predistortion circuit for reducing distortion in the transmission of analog signals. The distortion so generated by such a circuit, or predistortion, is fixed for a given circuit to be substantially equal in magnitude and opposite in sign to the second or higher order intermodulation product distortion inherent in a nonlinear modulation device such as a laser diode to which the signal is applied. The real component of the predistortion signal is produced by a first device such as an amplifier, and is selected in amplitude to match the amplitude of the distortion by the nonlinear device. The imaginary component of the predistortion signal is selected through introduction of a distortion signal out phase with the real component of the predistortion signal on the in-line electrical path. The real and imaginary components are combined to produce a single modulation signal including inter-modulation product distortion for application to the nonlinear device. The in-line predistortion circuit linearizes the transmission of modulating signals by cancelling distortion inherent in nonlinear transmitting devices.

The distortion in the signal generated by a nonlinear device can be represented as a complex quantity with amplitude and phase. Using conventional phasor notation, the distortion at some frequency ω can be expressed as $Ae^{i(\omega t+\Phi)}$, where A is the amplitude and $\Phi$ is the phase of the signal. Equivalently, one can separate the distortion into two components, A cos ($\Phi$), which is represented by the real part, and A sin($\Phi$), which is represented by the imaginary part. Amplitude and phase can be uniquely derived from real and imaginary part, so both notations are equivalent. For the distortion circuits that are going to be described hereunder, it is more convenient to express distortion in terms of real and imaginary part, since some of the circuits create mainly real distortion, while others create mainly imaginary distortion. In general, the pre- or post-distortion circuits must be able to generate both components, that is both real and imaginary distortion, in order to equalize the nonlinearity of the device. To do so several distortion circuits might be needed and cascaded so as to produce different types of distortion.

Figure 1A:
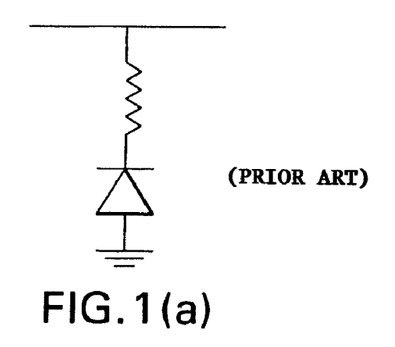
FIG. 1(a) is a pre-distortion circuit with ideal Shottky diode according to the prior art.
Figure 1B:
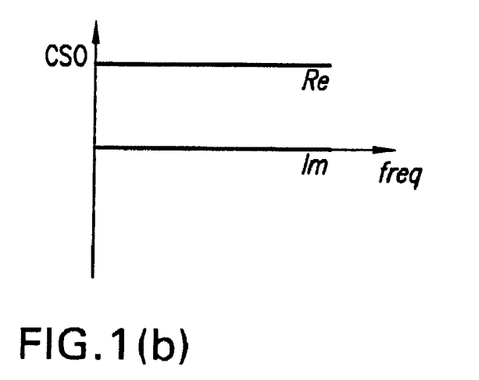
FIG. 1(b) is a graph of the real and imaginary components of second order distortion (CSO) associated with such circuit.

A typical pre-distortion circuit according to previous art is displayed in FIG. 1, where the nonlinearity is produced by an ideal forward-biased Schottky diode illustrated in FIG. 1(a). As shown in FIG. 1(b), the second order distortion (CSO) of such a device is plotted by an ideal diode is real and independent of frequency.

Figure 2A:
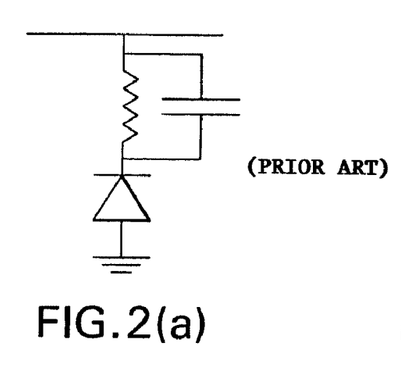
FIG. 2(a) is a pre-distortion circuit with ideal Shottky diode and reactive elements according to the prior art.
Figure 2B:
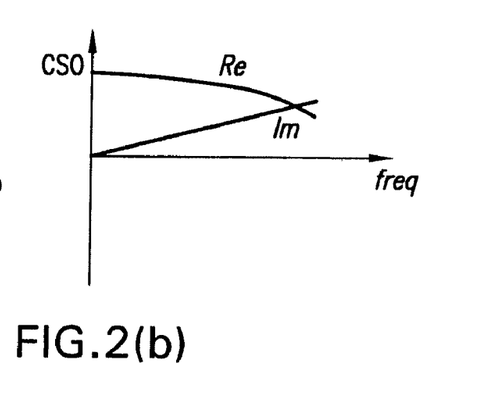
FIG. 2(b) is a graph of the real and imaginary components of second order distortion (CSO) associated with such circuit.
Figure 3A:
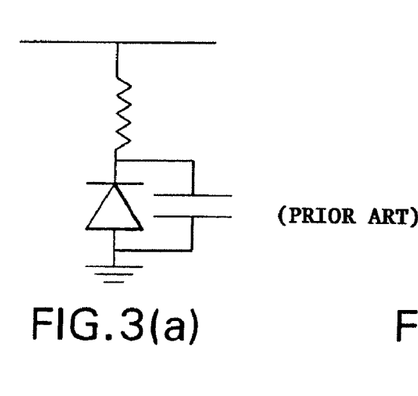
FIG. 3(a) is a pre-distortion circuit with ideal Shottky diode and reactive elements according to the prior art.
Figure 3B:
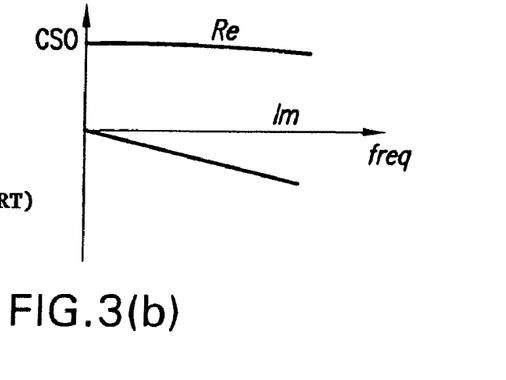
FIG. 3(b) is a graph of the real and imaginary components of second order distortion (CSO) associated with such circuit.

If one needs to produce imaginary distortion, one can add some reactive elements such as a capacitor as shown in FIGS. 2 and 3. The strength of the imaginary part depends on the bias point and the value of the capacitance, and can become comparable to the real part at CATV frequencies (<550 MHz). These reactive elements could also be parasitics intrinsic to a non-ideal diode. Another way to produce imaginary distortion according to previous art is displayed in FIG. 4, where the nonlinear element is a reverse-biased varactor. Many other combinations using various reactive components are also possible. These circuits were disclosed as pre-distortion circuits in the previous art, but can also be used as post-distortion circuits.

The previous art represented by circuits shown in FIG. 1 to 3 lacks flexibility. The distortion phase as a function of frequency depends on the value of the capacitors, which according to the prior art is fixed.

The first aspect of the present invention consists of using one or more varactors as variable capacitors to adjust the phase and frequency content of the distortion. Varactors should be selected such that their response is as linear as possible, as described below.

Figure 5:
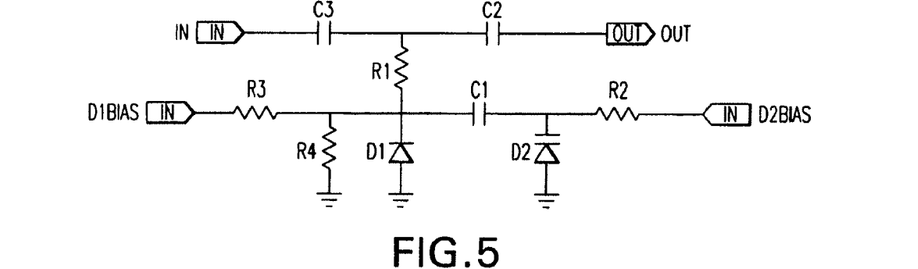
FIG. 5 is a distortion circuit in accordance with a first embodiment of the present invention.

FIG. 5, for example, shows a distortion circuit for correcting the distortion from an external nonlinear circuit element. The distortion signal corrects the distortion by generating a frequency dependent signal having a sign opposite to the distortion signal produced by the nonlinear circuit and substantially the same magnitude.

FIG. 5 has an input signal IN. A first nonlinear device D1 is coupled to the input signal IN for generating a first signal at a cathode of the nonlinear device D1 and has a first bias level at the cathode.

A second nonlinear device D2 is different from the first nonlinear device D1 and is coupled to the first nonlinear device D1 to modify the first signal and produce an output second signal OUTPUT. The second nonlinear device D2 has a second bias level at a cathode of the second nonlinear device D2. A bias control means D1BIAS, D2BIAS is provided for adjusting said first and said second bias levels so that the magnitude, phase and frequency of the output second signal can be adjusted.

Within the circuit of FIG. 5, C1, C2 and C3 are DC blocking capacitors. R2, R3 and R4 are biasing resistors.

The amount of second order distortion generated by the Schottky diode D1 is controlled by a voltage D1BIAS. The phase and frequency response is controlled by D2BIAS, where D2 behaves as a variable capacitor. Other possible embodiments would include a varactor acting as a variable capacitor in parallel with R1, either in addition or without D2, and reversing diode D1 to produce the opposite sign of distortion. Other reactive or resistive components can be added to introduce phase and frequency shifts. The circuits are shown with the diodes in a shunt configuration with the RF path. Alternatively, the diodes could we configured in series with the RF path.

In the circuit in FIG. 5, either the input or output (IN or OUT, respectively) are connected to the device that needs to be linearize, depending on whether the circuit is used as a post-distortion or pre-distortion circuit. In an exemplary application, the input would be connected to an optical receiver as a post-distortion circuit. In another exemplary application, the output would be connected to a semiconductor laser as a pre-distortion circuit. Alternatively, this could be part of a cascade of several pre- or post-distortion circuits, where either the input or the output is connected to the next distortion stage.

In general, the distortion circuit of FIG. 5 may be used for correcting the distortion from a nonlinear circuit element by generating a frequency dependent signal having a sign opposite to the distortion signal produced by the nonlinear circuit and substantially the same magnitude. An input (IN) is provided for receiving an RF signal from the non-linear circuit element. A Schottky diode D1 is provided with an anode connected to ground and a cathode coupled between an input and an output of the distortion circuit of FIG. 5. A first bias control input (DBIAS IN) connected to the cathode of the Schottky diode D1 is provided that controls a second order distortion of the distortion circuit. A varactor D2 is provided with an anode connected to ground and a blocking capacitor connecting a cathode of the reverse biased varactor to the cathode of the Schottky diode D1. A second bias control input (D2BIAS IN) connected to a cathode of the varactor D2 is provided that controls a phase and frequency response of the distortion circuit. The output may be connected to a signal processing device for transmitting the input RF signal plus the distortion generated by distortion circuit to the signal processing device.

Depending on the degree of linearization required by a particular application, and on the degree of repeatability of the nonlinear device, the distortion settings could be fixed, tuned for each batch of parts, tuned at manufacturing for each individual part, or tuned in real time as a function of some measured parameter in a feed-back loop.

Figure 6A:
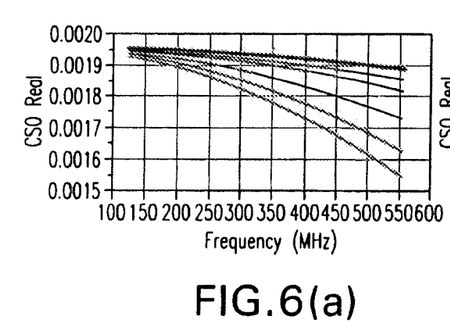
FIGS. 6a and 6b are typical real and imaginary second order distortion (CSO) respectively generated by the circuit in FIG. 5 as a function of frequency.
Figure 6B:
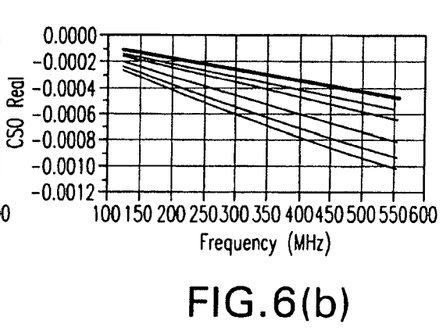

FIG. 6 depicts the real (left plot) and imaginary (right plot) parts of the second order distortion generated by the circuit in FIG. 5 as a function of frequency. D1BIAS is fixed at a voltage such that the distortion generated by D1 is largest. The various curves correspond to different values of D2BIAS. The bold curves are for highest voltage at D2BIAS, such that the capacitance of D2 is very low, and the distortion produced by the circuit is mainly real. As one reduces the voltage at D2BIAS, capacitance increases, and the distortion at higher frequencies becomes less real and more imaginary. By controlling D1BIAS and D2BIAS one can adjust both the real and imaginary distortion.

Figure 7:
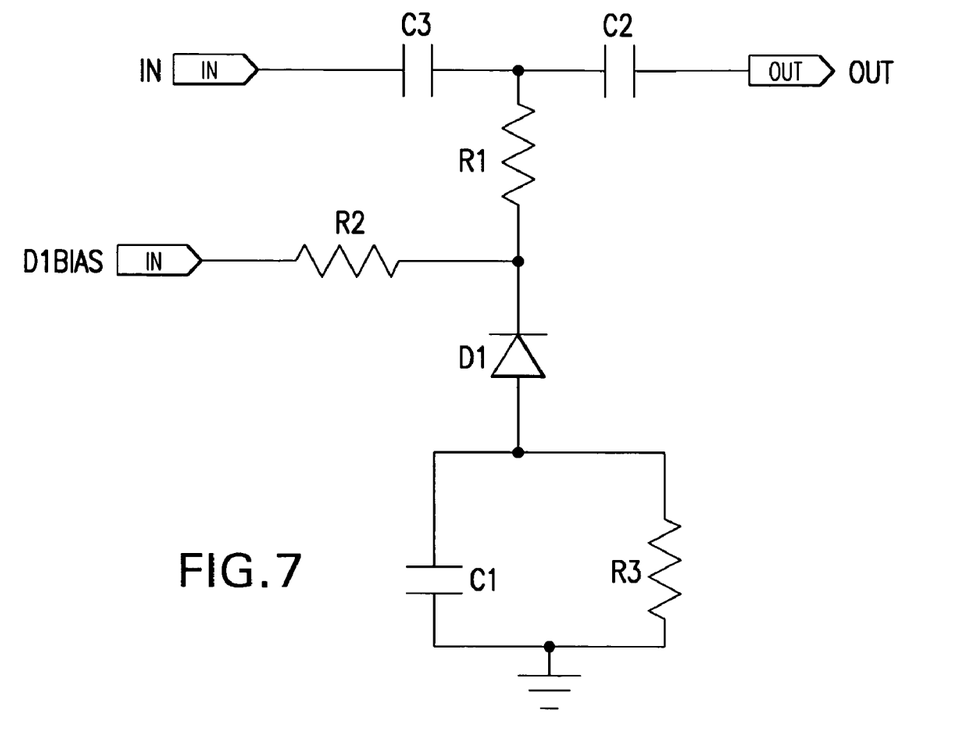
FIG. 7 is a schematic diagram of a distortion circuit in accordance with a second embodiment the present invention with a reverse-biased Schottky diode.
Figure 8:
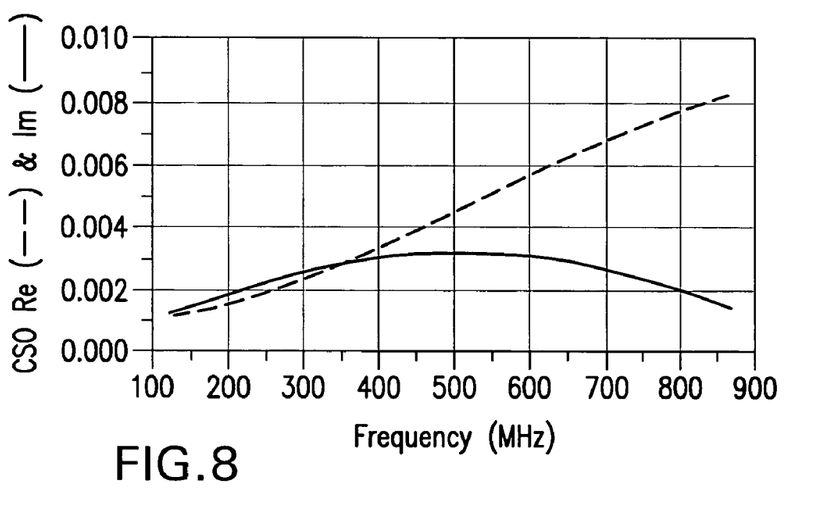
FIG. 8 is a graph depicting the real and imaginary distortion generated by the circuit in FIG. 7.

Another way to produce distortion that has strong frequency dependence is to use a reverse-biased Shottky diode, as depicted in FIG. 7. The nonlinear capacitance of the diode produces distortion with the magnitude of the real part increasing as the frequency increases. FIG. 8 shows the real and imaginary part of the circuit in FIG. 5 at a reverse bias condition.

Figure 4A:
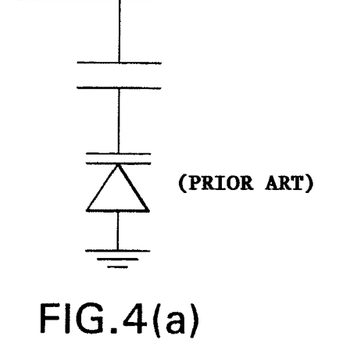
FIG. 4(a) is a pre-distortion circuit with ideal varactor according to the prior art and 4(b) is a graph of the real and imaginary components of second order distortion (CSO) associated with such circuit.
Figure 4B:
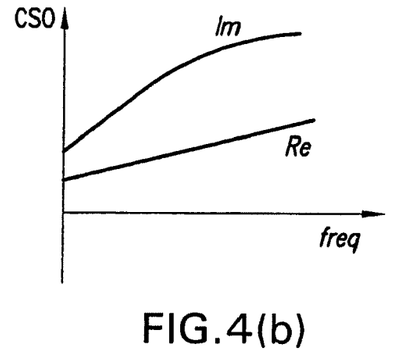

The circuit depicted in FIG. 4 is usually used when large amounts of imaginary distortion are needed. However, in order to create large distortion a large capacitor in series with the varactor is needed which results in poor return loss and high insertion loss at high frequencies. In addition, the real part generated by this circuit might not be desired. The second aspect of this invention is aimed at providing design guidelines to select the right varactor so that large amounts of distortion are generated with low insertion loss and good return loss.

The nonlinear capacitance of a varactor is usually modeled as $$C = C_{j0}\left(1 - \frac{V}{V_j}\right)^{-M}$$

where V is the voltage applied across the varactor. It can be shown that the amount of distortion produced by the varactor is inversely proportional to the ratio $V_j/M$. For the application in the previous section, one has to select a varactor with large $V_j/M$ ratio. For the circuit in FIG. 4 one has to select a part such as Skyworks SMV-1247, which has a small $V_j/M$ ratio.

Figure 9:
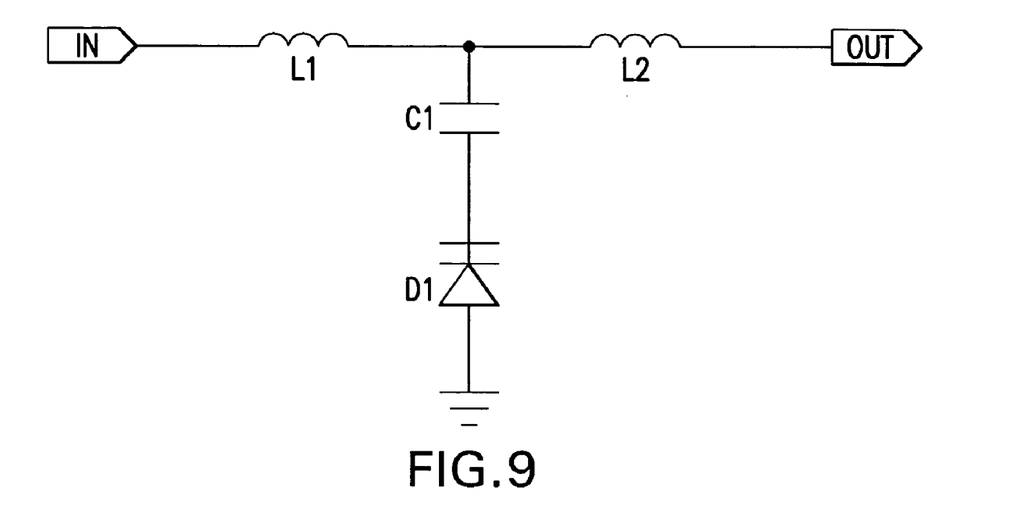
FIG. 9 is a distortion circuit according to the new art. Inductors L1 and L2 are used to tune the real part of the distortion.

For some applications, like equalization of distortion introduced by fiber dispersion, a circuit producing mainly imaginary distortion and linear with frequency is needed. In that case, the circuit in FIG. 4 might not be optimum, since it introduces some real distortion and the amount of imaginary distortion saturates at high frequencies. In order to prevent this effect, one can add an inductor after and/or before the pre-distortion circuit as shown in FIG. 9. The value of the inductors L1 & L2 will need to be selected according to the series capacitor and the required frequency and phase response of the distortion.

Figure 10:
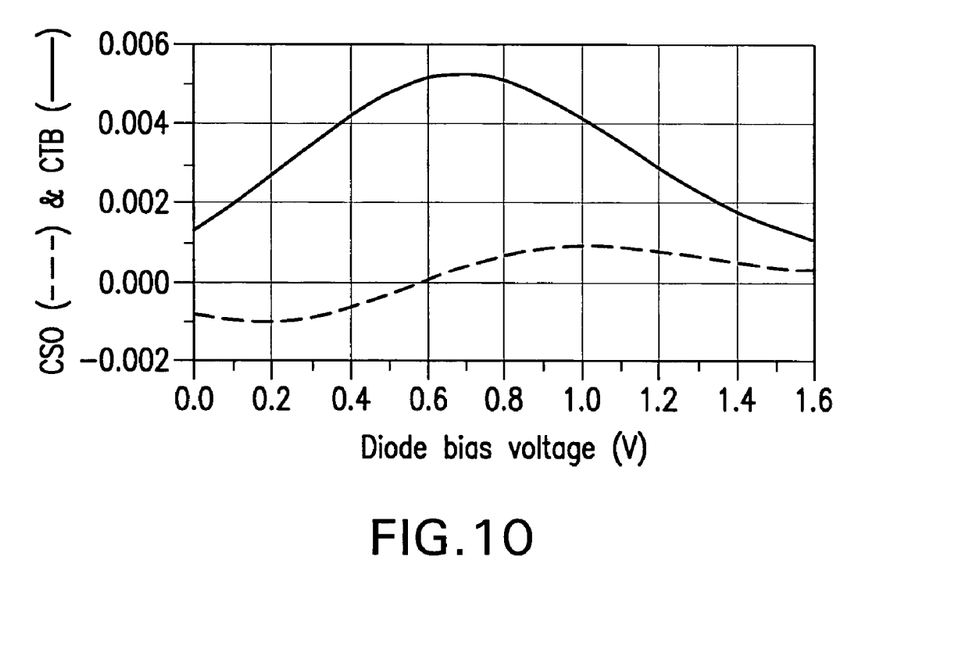
FIG. 10 is typical real CSO & CTB generated by the circuit in FIG. 3 as a function of some bias voltage.
Figure 11:
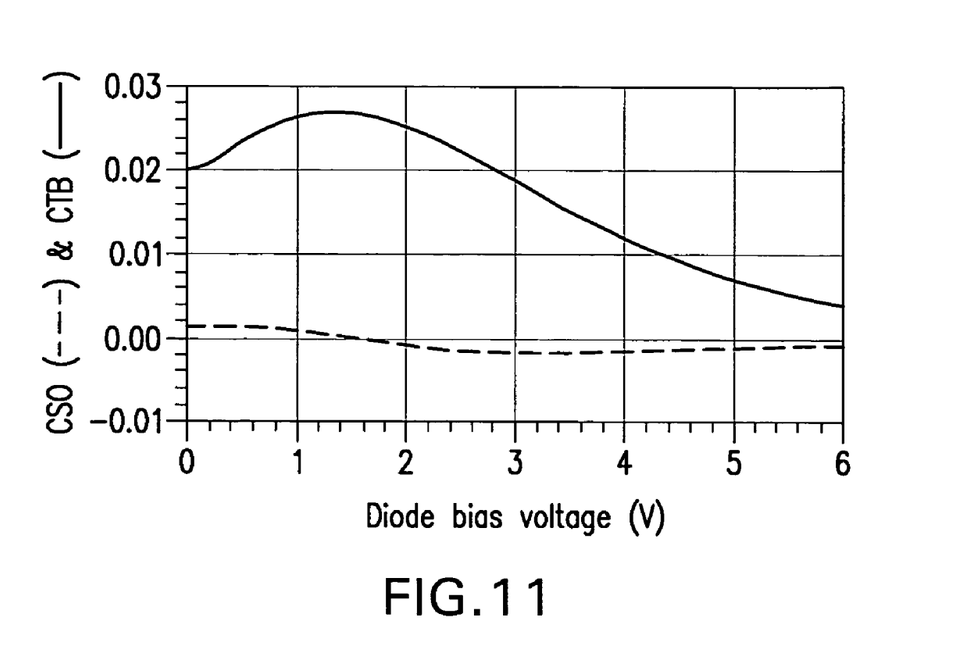
FIG. 11 is typical imaginary CSO & CTB generated by the circuit in FIG. 4 as a function of some bias voltage.
Figure 12:
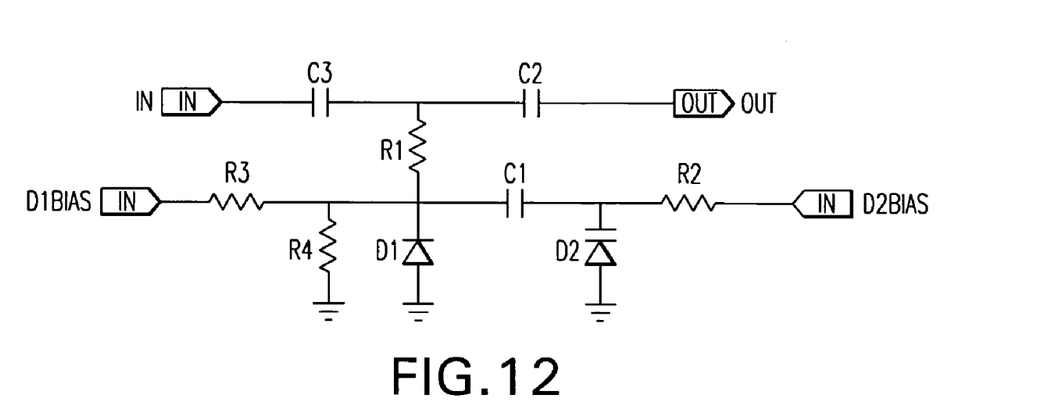
FIG. 12 is a distortion circuit according to the new art with a Schottky diode to produce mainly real distortion and a PIN diode to attenuate the distortion.
Figure 13:
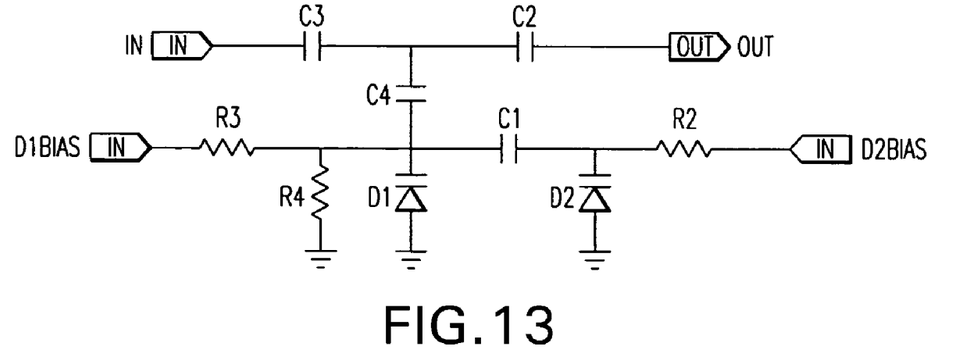
FIG. 13 is a distortion circuit according to the new art with a varactor diode to produce mainly imaginary distortion and a quasi-linear varactor diode to attenuate the distortion.

The final part of this invention deals with the fact that circuits that generate second order distortion also generate third order distortion. As shown in FIGS. 10 and 11, the second order and third order distortion generated by circuits in FIGS. 3 and 4 vary depending on the bias voltage. Around the bias voltage at which CSO is the largest, the residual CTB is the lowest. Often, the amount of CSO needs to be tuned for each particular circuit. If we tune it by varying the bias voltage, undesired CTB could be generated. One can adjust the amount of CSO by changing the values of resistor and capacitor in FIGS. 3 and 4, respectively. This can be time consuming and not practical. Another method is to use a PIN diode or a quasi-linear varactor (see above for selecting a quasi-linear varactor) as voltage controlled resistor and capacitor, respectively. Since depending on the bias voltage, the CTB generated by the circuits in FIGS. 3 and 4 can be either positive or negative, one could simultaneously cancel CSO and CTB. FIGS. 12 and 13 contain exemplary embodiments of the invention. C1, C2 and C3 are DC blocking capacitors and R2, R3 and R4 are biasing resistors. FIG. 12 is a circuit that produces mainly real distortion. D1 is a Schottky diode that produces distortion as depicted in FIG. 10 as voltage D1BIAS is varied, and D2 is a quasi-linear PIN diode that acts as a variable resistor to attenuate the amount of CSO and CTB generated as D2BIAS is varied. FIG. 13 is a circuit that produces mainly imaginary distortion. D1 is a varactor diode that produces distortion as depicted in FIG. 11 as voltage D1BIAS is varied, and D2 is a quasi-linear varactor diode that acts as a variable capacitor to attenuate the amount of CSO and CTB generated as D2BIAS is varied. Using both controls D1BIAS and D2BIAS, the amount of CSO and CTB can be independently adjusted. Other reactive and resistive components, as well as PIN diodes or quasi-linear varactor diodes could be added to these circuits, as previously disclosed, to further adjust the phase and frequency dependence of the distortion. In addition, diodes could be used in series with the RF path rather than in a shunt configuration.

Figure 14:
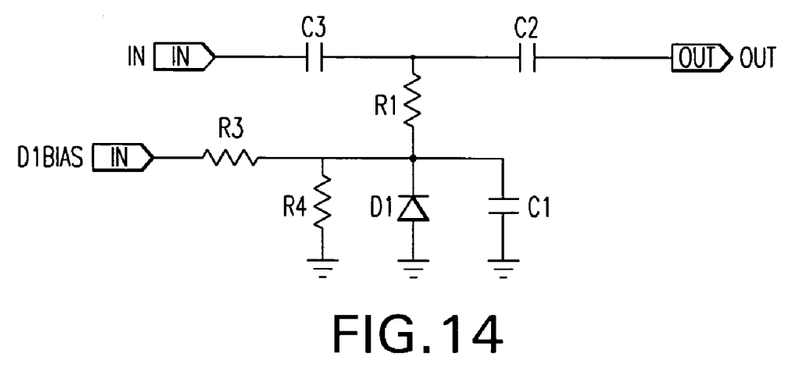
FIG. 14 is a distortion circuit according to the new art with a Schotty diode to produce mainly real distortion and a capacitor to affect the frequency dependence of the distortion.
Figure 15A:
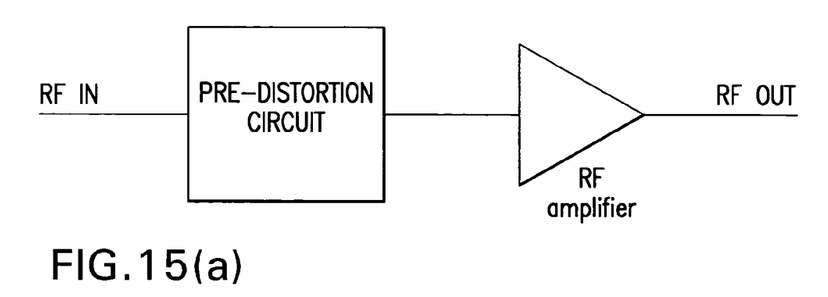
FIGS. 15(a) through (d) are typical application circuits where the circuit according to the present invention would be used.
Figure 15B:
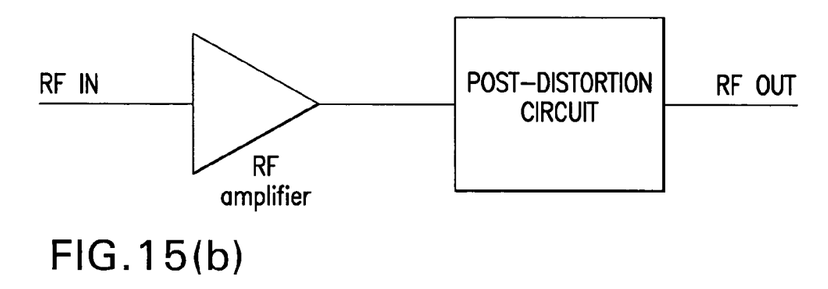
Figure 15C:
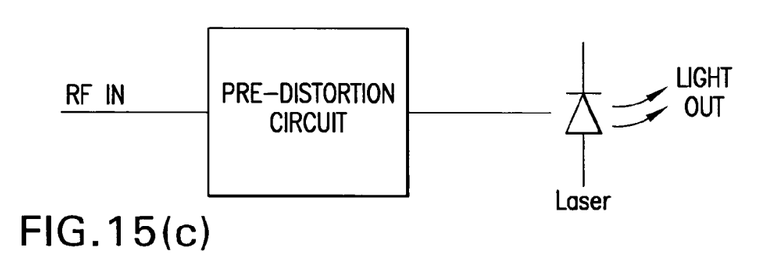
Figure 15D:
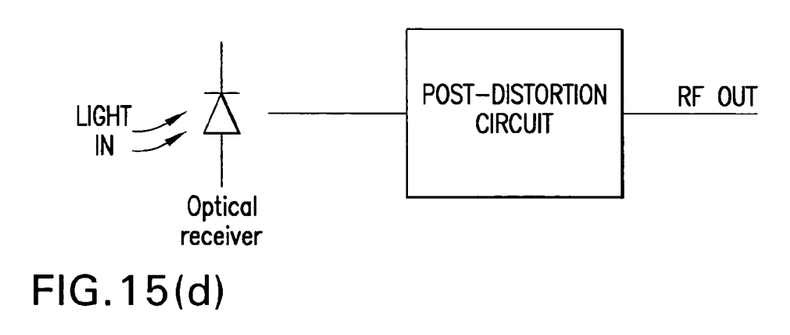

All circuits previously disclosed produce second order distortion that is relatively independent of the input frequencies, and only dependent on the beat frequency. For example, distortion at 60 MHz generated by a pair of tones at 61.25 MHz and 121.25 MHz is the same as distortion generated at 60 MHz generated by a pair of tones at 481.25 MHz and 541.25 MHz. However, some nonlinear devices produce distortion that is dependent on the input frequencies, and previously disclosed distortion circuits might not be able to compensate the composite second order distortion. FIG. 14 discloses a new circuit according to the present invention that can produce distortion that is dependent on the input frequencies. By using a relatively large value of capacitor C1, the circuit can generate distortion that is dependent on the input frequencies. Other reactive components could be added that would generate a similar effect. Alternatively, active components such as varactors acting as linear variable capacitor could be used to enhance flexibility.

FIG. 15 are typical application circuits where the distortion circuits disclosed in this invention could be used. Drawings (a) and (b) describe circuits for canceling the distortion of an RF amplifier, first as a pre-distortion circuit prior to the amplifier, and second as a post-distortion circuit following the amplifier. Drawing (c) shows a pre-distortion circuit used to linearize a laser, and drawing (d) shows a post-distortion circuit used to linearize an optical receiver.

What is claimed is:

1. A distortion circuit for correcting distortion from a nonlinear circuit element by generating a frequency dependent signal having a sign opposite to the distortion signal produced by the nonlinear circuit and substantially the same magnitude comprising:
   an input signal;
   a resistor having a first terminal and a second terminal, the first terminal coupled to the input signal;
   a first nonlinear device coupled to said second terminal of the resistor for generating a first signal that mainly creates a real portion of the distortion, the first nonlinear device being biased at a first biased level;
   a capacitor having a first terminal and a second terminal, the first terminal coupled to the second terminal of the resistor;
   a second nonlinear device different from same first nonlinear device and coupled to said second terminal of the capacitor for modifying said first signal to produce an output second signal, said second nonlinear device having a second bias level that mainly creates an imaginary portion of the distortion;
   means for adjusting said first bias level so that the magnitude of the output second signal can be adjusted; and
   means for adjusting said second bias level so that the phase and frequency of the output second signal can be adjusted.

2. The circuit of claim 1 wherein said first nonlinear element is a Schottky diode, and said second nonlinear element is a varactor diode.

3. The circuit of claim 1 wherein said first and said second nonlinear element are reversed-biased.

4. The circuit of claim 1 wherein said first nonlinear element is forward-biased.

5. The circuit of claim 1, wherein one of said nonlinear elements is forward biased and the other nonlinear element is reversed biased.

6. The circuit of claim 1, wherein said means for adjusting said second bias level includes a reactive component.

7. The circuit of claim 1, wherein said means for adjusting said second bias level includes a varactor diode.

8. The circuit of claim 1, wherein said second nonlinear device is a PIN diode acting as a linear variable resistor.

9. The circuit of claim 1, wherein said means for adjusting said first and second bias levels permit simultaneous adjustment of second and third order distortion.

10. A distortion circuit for correcting distortion from a nonlinear circuit element by generating a frequency dependent signal having a sign opposite to the distortion signal produced by the nonlinear circuit and substantially the same magnitude comprising:
    an input signal;
    a first capacitor having a first terminal and a second terminal, the first terminal coupled to the input signal;
    a first resistor having a first terminal and a second terminal, the first terminal coupled to the second terminal of the first capacitor;
    a second capacitor having a first terminal and a second terminal, the first terminal coupled to the second terminal of the first capacitor;
    a first diode coupled to said second terminal of the resistor for generating a first signal;
    a first biasing voltage coupled to the second terminal of the resistor for biasing the first diode;
    a third capacitor having a first terminal and a second terminal, the first terminal coupled to the second terminal of the resistor;
    a second diode coupled to the second terminal of the third capacitor; and
    a second biasing voltage coupled to the second terminal of the third capacitor for biasing the second diode.

11. The circuit of claim 10, further comprising a first voltage divider for producing the first biasing voltage.

12. The circuit of claim 10, further comprising a second voltage divider for producing the second biasing voltage.

* * * * *